United States Patent
Ma

(10) Patent No.: US 8,154,105 B2
(45) Date of Patent: Apr. 10, 2012

(54) FLIP CHIP SEMICONDUCTOR DEVICE AND PROCESS OF ITS MANUFACTURE

(75) Inventor: Ling Ma, Torrance, CA (US)

(73) Assignee: International Rectifier Corporation, El Segundo, CA (US)

(\*) Notice: Subject to any disclaimer, the term of this patent is extended or adjusted under 35 U.S.C. 154(b) by 343 days.

(21) Appl. No.: 11/524,178

(22) Filed: Sep. 20, 2006

(65) Prior Publication Data

US 2007/0063316 A1   Mar. 22, 2007

Related U.S. Application Data

(60) Provisional application No. 60/719,617, filed on Sep. 22, 2005.

(51) Int. Cl.
*H01L 29/40* (2006.01)

(52) U.S. Cl. .............. 257/621; 257/698; 257/E23.011

(58) Field of Classification Search .............. 257/621, 257/698, E23.011
See application file for complete search history.

(56) References Cited

U.S. PATENT DOCUMENTS

| | | | | |
|---|---|---|---|---|
| 4,964,212 A * | 10/1990 | Deroux-Dauphin et al. | ... | 29/852 |
| 4,978,639 A | 12/1990 | Hua et al. | | |
| 5,438,212 A * | 8/1995 | Okaniwa | .................. | 257/275 |
| 5,496,755 A * | 3/1996 | Bayraktaroglu | .............. | 438/167 |
| 6,002,163 A * | 12/1999 | Wojnarowski | .............. | 257/620 |
| 6,087,719 A | 7/2000 | Tsunashima | | |
| 6,235,624 B1 | 5/2001 | Sasaki et al. | | |
| 6,429,509 B1 * | 8/2002 | Hsuan | .................. | 257/690 |
| 6,538,300 B1 * | 3/2003 | Goldberger et al. | .......... | 257/532 |
| 6,661,077 B2 | 12/2003 | Mashino | | |
| 6,703,689 B2 * | 3/2004 | Wada | .............. | 257/621 |
| 6,720,661 B2 * | 4/2004 | Hanaoka et al. | .............. | 257/774 |
| 6,734,528 B2 * | 5/2004 | Rhee et al. | .............. | 257/621 |
| 6,800,920 B2 * | 10/2004 | Nishijima | .............. | 257/531 |
| 6,822,316 B1 * | 11/2004 | Hsuan | .............. | 257/621 |
| 6,828,656 B2 * | 12/2004 | Forbes et al. | .............. | 257/621 |
| 6,838,377 B2 * | 1/2005 | Tonami et al. | .............. | 438/667 |
| 6,856,004 B2 * | 2/2005 | Kiaei et al. | .............. | 257/587 |
| 6,873,054 B2 * | 3/2005 | Miyazawa et al. | .............. | 257/774 |
| 6,882,030 B2 * | 4/2005 | Siniaguine | .............. | 257/621 |
| 6,903,012 B2 * | 6/2005 | Geefay et al. | .............. | 438/667 |
| 6,903,443 B2 * | 6/2005 | Farnworth et al. | .............. | 257/621 |
| 7,030,010 B2 * | 4/2006 | Farnworth et al. | .............. | 438/639 |
| 7,091,124 B2 * | 8/2006 | Rigg et al. | .............. | 438/667 |
| 7,115,972 B2 * | 10/2006 | Dotta et al. | .............. | 257/621 |
| 7,193,297 B2 * | 3/2007 | Yamaguchi | .............. | 257/621 |
| 7,199,050 B2 * | 4/2007 | Hiatt | .............. | 438/667 |
| 7,230,318 B2 * | 6/2007 | Kripesh et al. | .............. | 257/621 |
| 7,276,738 B2 * | 10/2007 | Wada | .............. | 257/98 |
| 7,276,780 B2 * | 10/2007 | Dotta et al. | .............. | 257/621 |
| 7,279,776 B2 * | 10/2007 | Morimoto | .............. | 257/621 |
| 7,291,899 B2 * | 11/2007 | Falck et al. | .............. | 257/621 |
| 7,300,857 B2 * | 11/2007 | Akram et al. | .............. | 438/459 |
| 7,329,943 B2 * | 2/2008 | Kirby et al. | .............. | 257/621 |
| 7,429,529 B2 * | 9/2008 | Farnworth et al. | .............. | 438/667 |
| 7,442,642 B2 * | 10/2008 | Dotta | .............. | 438/667 |
| 2003/0038344 A1 * | 2/2003 | Palmer et al. | .............. | 257/621 |
| 2003/0141571 A1 * | 7/2003 | Itoh | .............. | 257/621 |
| 2006/0289968 A1 * | 12/2006 | Sulfridge | .............. | 257/621 |
| 2007/0045780 A1 * | 3/2007 | Akram et al. | .............. | 257/621 |

\* cited by examiner

*Primary Examiner* — David Zarneke

(74) *Attorney, Agent, or Firm* — Farjami & Farmami LLP

(57) ABSTRACT

A semiconductor die and method of making it are provided. The die includes a first via extending through the entire thickness of the die and a first via electrode disposed inside the via electrically connecting an electrode at a top surface of the die with another electrode disposed at a bottom surface of the die.

15 Claims, 3 Drawing Sheets

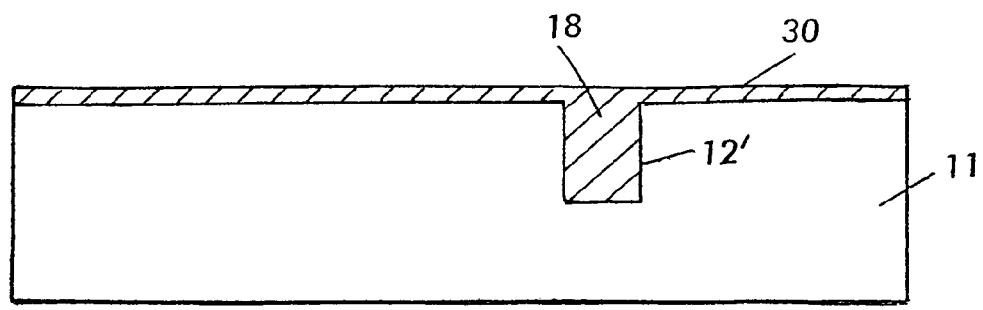
FIG. 4
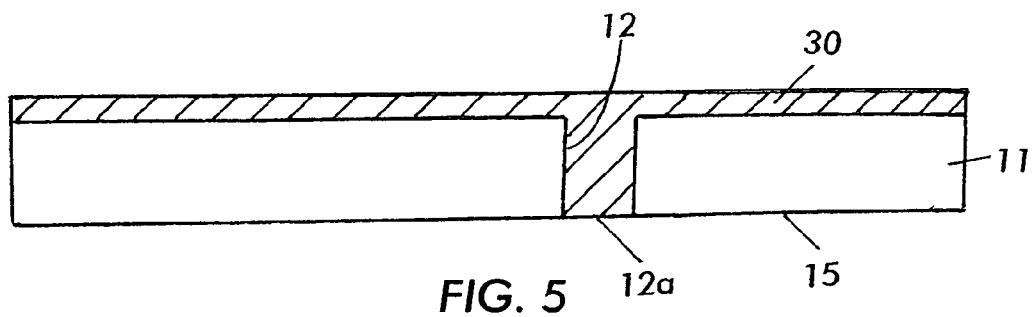
FIG. 5
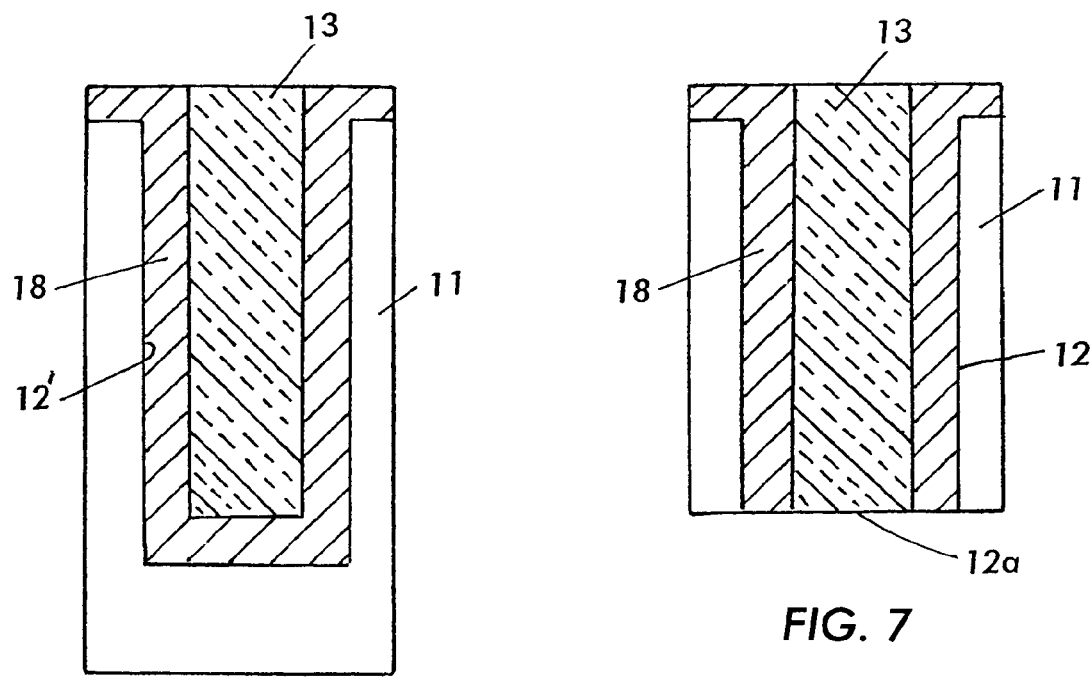
FIG. 6
FIG. 7

FLIP CHIP SEMICONDUCTOR DEVICE AND PROCESS OF ITS MANUFACTURE

RELATED APPLICATIONS

The present application claims priority from U.S. Provisional Application 60/719,617, filed on Sep. 22, 2005, the disclosure of which is incorporated in full by reference herein.

FIELD OF THE INVENTION

This invention relates to semiconductor devices, and more specifically, to a flip chip type power semiconductor device.

BACKGROUND AND SUMMARY OF THE INVENTION

It is well known that the electrodes of a flip chip device are disposed on the same surface of the die so that the device can be soldered or otherwise conductively connected to pads on a support surface such as a printed circuit board. U.S. Pat. No. 6,653,740, issued Nov. 25, 2003 and assigned to the assignee of the present application, discloses a vertical conduction flip chip MOSFET with a drain electrode on the top of the die connected to the drift region through a trench filled with a conductive material. The device disclosed in U.S. Pat. No. 6,653,740, is formed in a epitaxial silicon that is disposed on a float zone type substrate. Such a device is typically about 500 μm thick.

In the recent years, vertical conduction (power electrodes on opposite sides of the die) power semiconductor devices being less than 200 microns thick (otherwise referred to as thin die) have gained popularity due to their cost advantage and low resistivity, among other characteristics.

It is desirable to have a thin power semiconductor device having all electrodes on the same surface.

SUMMARY OF THE INVENTION

A semiconductor die according to the present invention includes is a vertical conduction power semiconductor device having a first via extending through an entire thickness of the semiconductor body thereof and a first via electrode disposed inside the via electrically connecting a power electrode at a top surface of the die with another power electrode disposed at a bottom, opposite surface of the die.

According to an aspect of the present invention, the die is a vertical conduction flip chip MOSFET that is less than 200 micrometers thick.

In another embodiment, an oxide material, a nitride material or a copper material may be disposed inside the via such that, the via electrode is closer to a side wall of the via than the at least one material.

A process for fabricating a flip chip device according to the present invention includes depositing on a die a mask to define an area for a trench; etching the die to a depth less than the entire thickness of the die to form a trench; adding a metal via electrode into the entire depth of the trench; grinding the die to a final thickness to expose the trench at the bottom surface of the die in order to form a via; forming a power electrode electrically connected to the metal via electrode, and forming a back metal on the bottom surface of the die electrically connected to the metal via electrode.

BRIEF DESCRIPTION OF THE DRAWINGS

FIG. 4 shows the structure of FIG. 3 after the trench is filled with front metal, or copper plating.

FIG. 5 shows the structure of FIG. 3 after the die is ground to its final thickness.

FIGS. 6 and 7 show the detail of the drain via process before and after respectively the back grind, and show the added use of an oxide, nitride or copper plating plug in the center of the via according to the second embodiment of the present invention.

DETAILED DESCRIPTION OF THE INVENTION

Aspects of the invention and the process for making the same will now be described with reference to FIGS. 1-8.

Figure 1:
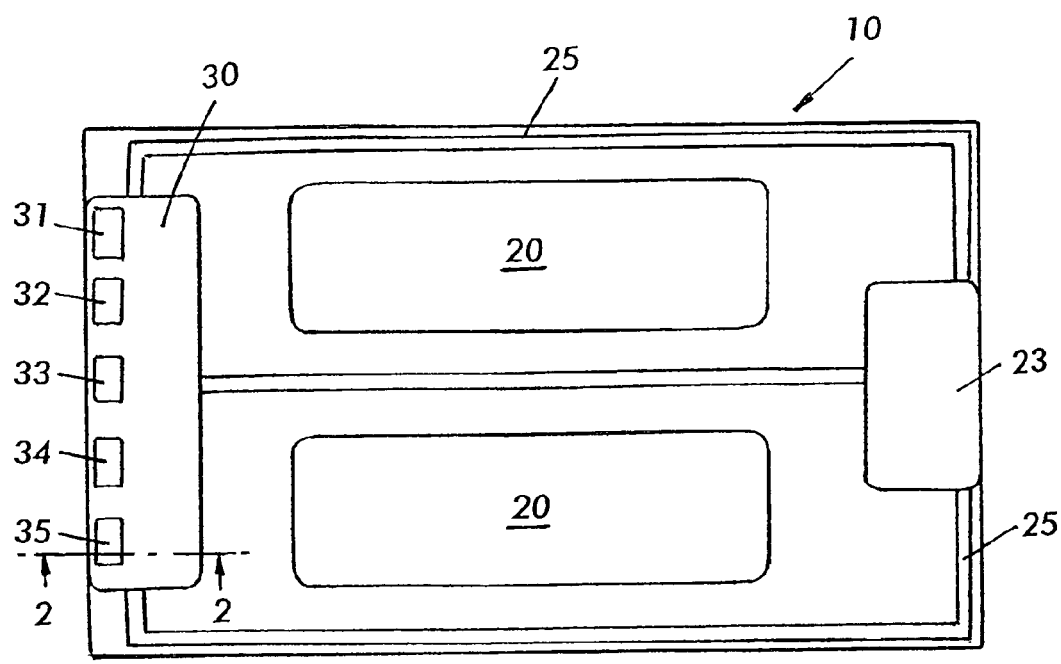
FIG. 1 shows a top plan view of a flip chip die made in accordance with the invention, showing drain, gate and source pads all on the same surface.

FIG. 1 illustrates a top plan view of a die 10 configured as a flip chip in accordance with the present invention, including source pads 20, gate pad 23, gate bus 25 and drain pad 30 including a plurality of vias 31-35. Note that a semiconductor device according to the present invention is a vertical conduction device (i.e. a device in which the current includes a vertical path from the top to the bottom such as a device illustrated by U.S. Pat. No. 6,653,740 the disclosure of which is incorporated by reference), which has been adapted for flip-chip mounting so that it may take advantage of the efficient arrangement and high current capability of a vertical conduction device, and the advantages of a flip chip mountable power semiconductor device.

Figure 2:
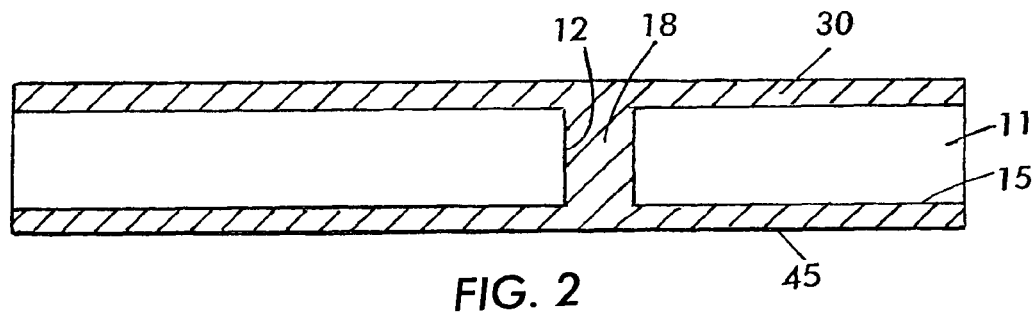
FIG. 2 shows a cross-sectional view of a device according to the first embodiment of the present invention viewed along line 2-2 in FIG. 1 in the direction of the arrows.

Referring to FIG. 2, a semiconductor device according to the present invention is a power MOSFET which includes a via 12 (preferably a plurality of vias) with a via electrode 18 disposed therein. Via electrode 18 electrically connects back drain electrode 45 formed on a bottom surface 15 of semiconductor body 11 to front drain electrode 42. In the preferred embodiment, via electrode 18 is electrically connected to semiconductor body 11. Note that according to an aspect of the present invention, via 12 is formed outside the termination region (i.e. is inside the street region) in order to prevent shorting between the source and the drain.

A process for manufacturing a device according to the present invention will now be described with reference to FIGS. 3-5. It will be noted that the processing steps described refer to the die 10; however, it will be understood that typically a wafer (not shown) comprising more than one such die will be manufactured at the same time using similar processing steps.

Figure 3:
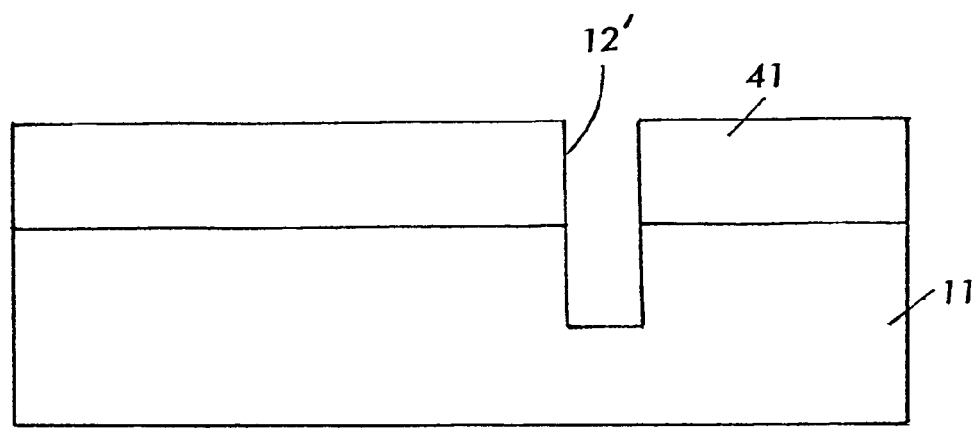
FIG. 3 shows a portion of a die in cross-section, after an initial process step in which a trench is etched into the die.

Referring to FIG. 3, a trench 12' is etched into a die 10 using preferably a photo resist mask 41 that defines the area to be etched.

Referring to FIG. 4, trench 12' is filled with metal or copper is plated on the walls and preferably the bottom of trench 12' to define via electrode 18 inside trench 12' and preferably at the same time drain electrode 30 on the top surface of body 11. It should be understood that via electrode 18 need not be made of the same material as drain electrode 30 formed at the top surface of die 10.

Referring next to FIG. 5, according to one aspect of the present invention, in a grinding step, semiconductor body 11 is ground from the back until at least the bottom of trench 12' is reached, whereby trench 12' is transformed into via 12. Note that to form a thin power semiconductor die semiconductor body 11 is ground to a thickness of at least less than 200 μm, preferably to 75 μm and most preferably to a thickness of 50 μm or less when possible. After grinding, back metal is deposited on back surface 15 of body 11 by sputtering or the like to form back drain electrode 45. Back drain electrode 45 can help render structural rigidity to the thin die, improve heat dissipation from the back of the die, and allow access for electrical connection to the back of the die.

Referring to FIGS. 6 and 7, in an alternative embodiment the sidewalls of trench 12' are plated leaving trench 12' otherwise void, and a dielectric material, such as an oxide or nitride, is then deposited inside trench 12' next to via electrode 18 which is lining the sidewall and preferably the bottom of trench 12' to form plug 13. Thereafter, body 11 is ground as described earlier. FIG. 7 shows trench 12' after the grinding step to expose the bottom of trench 12A at the bottom surface 15 of die 10 and form a via 12 according to the present invention. Next, back drain electrode 45 is formed as described earlier. Plug 13 may advantageously protect via electrode 18 to provide resistance to wear or may serve as an insulation material.

Alternatively, plug 13 may be formed with a conductive material such as copper. It is to be understood that when a copper plating material is used to form plug 13, it will augment the conductivity of via electrode 18.

Figure 8:
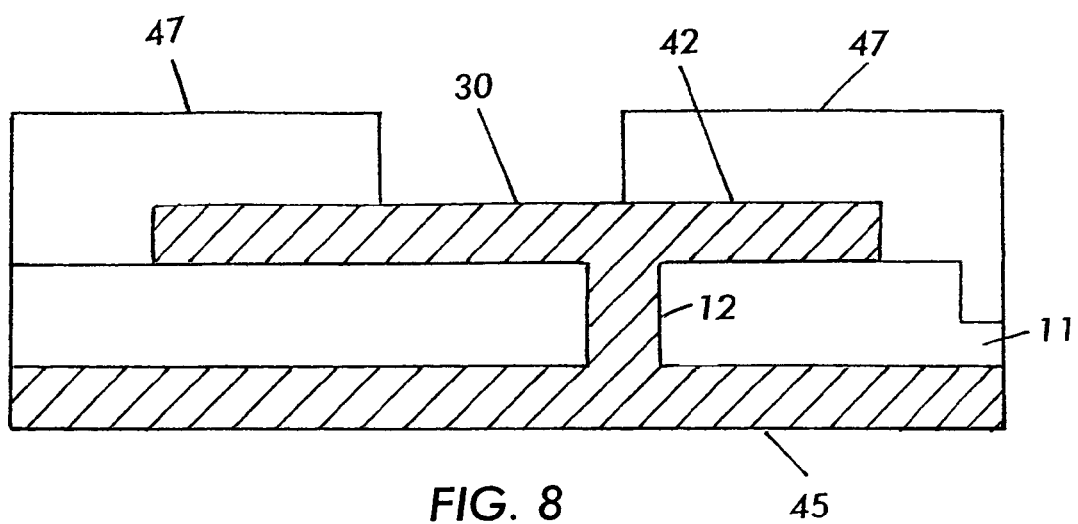
FIG. 8 shows a portion of a device according to the present invention after the application of a solder resist passivation.

Referring now to FIG. 8, a passivation body 47 may be applied at least to the front face of the device. Passivation body may include openings therein to allow access to drain electrode 30, source electrodes 20, and gate electrode 23, but may function as a solder resist in order to prevent the encroachment of solder from one electrode to another during solder reflow. A suitable material for passivation body 47 may be solder resist epoxy or the like polymer.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A semiconductor die having a depth of 50 micrometers or less, the semiconductor die comprising:
   a first via extending into the body of and through an entire depth of the die and spaced from a first edge of the die; and
   a first via electrode disposed inside the via electrically connecting a power electrode disposed on a top surface of the die with another power electrode disposed directly on and extending along an entire coplanar bottom surface of the die, wherein the via is disposed outside the termination region of the die.

2. The die of claim 1, wherein the die is a flip chip MOSFET.

3. The die of claim 1, further comprising at least one additional via identical to the first via and at least one additional via electrode identical to the first via electrode.

4. The die of claim 1, wherein the another power electrode extends along the entire bottom surface of the die.

5. The die of claim 3, wherein a pad electrically connects the first via electrode and the at least one additional via electrode.

6. The die of claim 1, further comprising a source electrode and a gate electrode on the top surface of the die, wherein the power electrode disposed on the top surface of the die comprises a drain electrode.

7. The die of claim 6, further comprising a gate bus extending along edges of the die, wherein the via is disposed between the gate bus and the first edge of the die.

8. The die of claim 1, wherein said first via electrode is electrically connected to the semiconductor die.

9. A vertical conduction power semiconductor device comprising:
   a semiconductor die;
   a first via extending into and through an entire depth of said die; and
   a first via electrode disposed inside said first via electrically connecting a power electrode disposed on a top surface of said die with another power electrode disposed directly on and extending along an entire coplanar bottom surface of said die, wherein said first via is disposed outside a termination region of said die.

10. The semiconductor device of claim 9, wherein said first via electrode is formed of a first material different from a second material used to form said power electrode.

11. The semiconductor device of claim 9, wherein said another power electrode extends along the entire bottom surface of said die.

12. The semiconductor device of claim 9, further comprising a source electrode and a gate electrode on said top surface of said die, wherein said power electrode disposed on said top surface of said die comprises a drain electrode.

13. The semiconductor device of claim 9, wherein said die is a flip chip MOSFET.

14. The semiconductor device of claim 9, further comprising at least one additional via identical to said first via and at least one additional via electrode identical to said first via electrode.

15. The semiconductor device of claim 11, wherein a pad electrically connects said first via electrode and said at least one additional via electrode.

* * * * *